United States Patent [19]

Vincent

[11] 3,988,635

[45] Oct. 26, 1976

[54] SLOW MOTION TIMING CIRCUIT FOR A STROBOSCOPE

[76] Inventor: Andrew W. Vincent, 65 Aberdeen St., Rochester, N.Y. 14619

[22] Filed: Apr. 5, 1974

[21] Appl. No.: 458,282

[52] U.S. Cl. .......................... 315/200 A; 307/293; 315/241 S; 324/16 T

[51] Int. Cl.² .................. H05B 37/00; H03K 3/284

[58] Field of Search .......................... 307/273, 293; 315/200 A, 205, 208; 324/16 T

[56] References Cited

UNITED STATES PATENTS

| | | | |
|---|---|---|---|
| 2,749,481 | 6/1956 | Klein, Jr. | 315/241 S |
| 3,294,983 | 12/1966 | Draper, Jr. | 307/293 X |
| 3,646,370 | 2/1972 | Lowe | 307/273 |
| 3,813,931 | 6/1974 | Rennick et al. | 324/16 T |

*Primary Examiner*—R. V. Rolinec
*Assistant Examiner*—Lawrence J. Dahl
*Attorney, Agent, or Firm*—Hoffman Stone

[57] ABSTRACT

A control circuit for triggering a stroboscope repetitively at successively longer intervals following successive input signals. It enables visual observation of a selected portion of the travel of a repetitively moving object with a cinematic slow motion effect. The circuit is relatively simple and includes a variable delay device, and means for varying the delay produced by it in accordance with a ramp voltage that has a period spanning several of the input signals, that is, several repetitions of the complete motion of the object to be observed.

3 Claims, 1 Drawing Figure

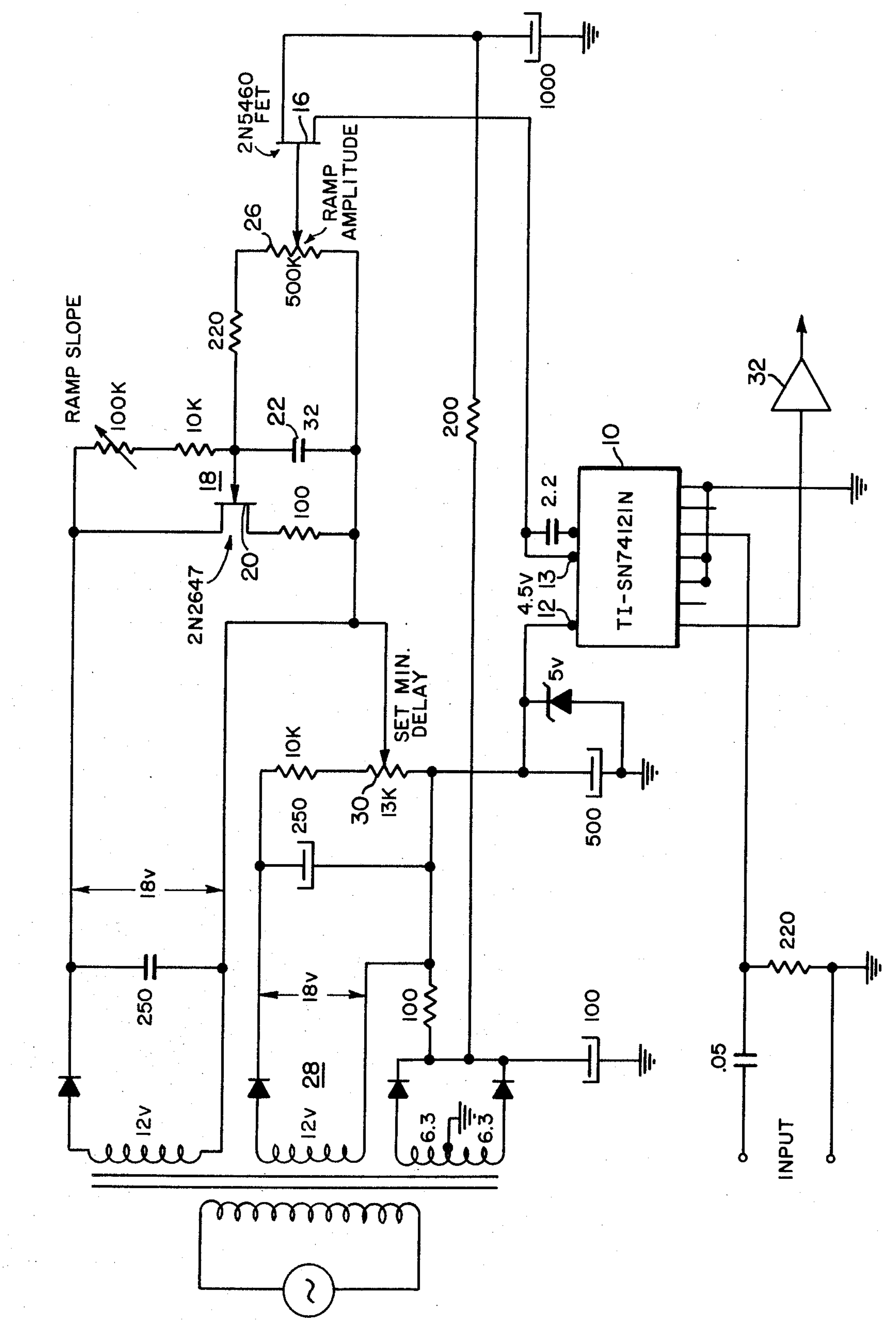
2N5460 FET
16
1000
RAMP AMPLITUDE
26
500K
220
RAMP SLOPE
100K
10K
22
32
200
18
100
2N2647
20
10
TI-SN74121N
2.2
4.5v
12
13
32
SET MIN. DELAY
5v
10K
30
13K
500
250
18v
250
18v
100
28
100
12v
12v
6.3
6.3
220
.05
INPUT

SLOW MOTION TIMING CIRCUIT FOR A STROBOSCOPE

BRIEF DESCRIPTION

This invention relates to a novel circuit for triggering a stroboscope to permit observation of a selected portion of the travel of a repetitively moving object as though it were presented in cinematic slow motion.

Circuits for triggering stroboscopes at selected intervals following the occurrence of an input signal are well known. See, for example, the patent to Klein, Jr., U.S. Pat. No. 2,749,481, issued June 5, 1956. They enable the repeated observation of a repetitively moving object at any desired point in its travel, but cannot, in practice, give a slow motion view of a portion of the travel of the object. The best that could be done, heretofore, in this regard entailed high speed photography, an expensive, and, in many cases, a highly inconvenient procedure.

Briefly, the circuit of the invention includes an electrically controllable, variable timer for producing an output signal at intervals of successively increased duration following each of a series of input signals. A ramp voltage is applied to the timer to cause the intervals to vary in accordance with the ramp so that, starting at the beginning of the ramp, the output signal of the timer occurs following an interval of minimum duration after the input signal, and the successive intervals are increasingly longer until the end of the ramp, whereupon the action is repeated. A d.c. voltage may be superimposed on the ramp voltage to control the starting point, that is, the duration of the minimum interval. The slope of the ramp is adjustable to enable selection of the degree of slow motion desired, and its amplitude is also adjustable to enable selection of the extent of the travel of the moving object that is to be observed.

DETAILED DESCRIPTION

A presently preferred embodiment of the invention will now be described in conjunction with the accompanying drawing, wherein the single FIGURE is a schematic circuit diagram, partly in block form of a timing circuit according to the invention.

The circuit includes an interval timer such as the monostable multivibrator 10 shown. The duration of the interval timed by the timer 10 is proportional to the value of the electrical resistance between two of its terminals 12 and 13, and the controlled channel of a field effect transistor 16 (FET) is connected between the two terminals 12 and 13. The FET is driven by a ramp generator 18, which includes a unijunction transistor 20, or other voltage sensitive avalanche discharge device, a capacitor 22, a variable charging resistor 24, and a variable voltage divider 26 connected across the capacitor 22. The movable contact of the voltage divider is connected to the control electrode of the FET. Changes in the value of the charging resistor 24 affect the slope of the ramp voltage and the duration of the ramp. Changes in the setting of the voltage divider 26 affect the amplitude of the ramp applied to the FET.

A d.c. bias may be superimposed on the ramp voltage from a separate rectified power supply 28 through a second variable voltage divider 30.

The monostable multivibrator 10 is triggered by any desired repetitive input signal, typically one produced in response to movement of the object to be observed past a selected point along its path of travel. The output of the multivibrator is applied to trigger the stroboscope, typically through an output amplifier 32 as shown.

The period of the ramp voltage generated by the generator 18 must be relatively long, several times the interval between successive ones of the input pulses, and the values of the various components of the circuit should, accordingly, be selected in view of the period of motion of the object to be observed to achieve the desired cinematic slow motion effect.

Typical values of the various different components are indicated in the drawing for a circuit capable of producing delay intervals of up to about twenty milliseconds, and ramp durations of up to about six seconds. These values are not an important feature of the invention, however, but were selected only in view of the nature of the particular device for which the circuit was developed.

What is claimed is:

1. A control circuit for triggering a stroboscope or similar device responsively to electrical input signals that occur at times when a repetitively moving object to be observed is at a preselected point in its travel, said circuit comprising a controllable interval timer, means for starting said timer in response to applied input signals, a ramp voltage generator, and means for controlling said interval timer responsively to the ramp voltage produced by said generator to cause the intervals timed by said timer to become successively longer as the ramp progresses, said interval timer including means for producing an output signal at the end of each interval timed by it for triggering the device to be triggered, the ramp voltage having a period several times the duration of the longest interval timable by said timer.

2. A control circuit according to claim 1 including also means for superimposing a d.c. bias on the ramp voltage produced by said generator, thereby to adjust the minimum value of the intervals timed by said timer.

3. A control circuit according to claim 1 wherein the period and the amplitude of the ramp voltage produced by said generator are both adjustable.

* * * * *